(12) United States Patent
Kim et al.

(10) Patent No.: US 9,954,047 B2
(45) Date of Patent: Apr. 24, 2018

(54) ORGANIC LIGHT EMITTING DISPLAY APPARATUS AND METHOD OF MANUFACTURING THE SAME

(71) Applicant: SAMSUNG DISPLAY CO., LTD., Yongin-si, Gyeonggi-do (KR)

(72) Inventors: Dongsoo Kim, Seoul (KR); Ji-Hyun Ka, Asan-si (KR)

(73) Assignee: SAMSUNG DISPLAY CO., LTD., Yongin-si, Gyeonggi-Do (KR)

(*) Notice: Subject to any disclaimer, the term of this patent is extended or adjusted under 35 U.S.C. 154(b) by 0 days.

(21) Appl. No.: 15/583,698

(22) Filed: May 1, 2017

(65) Prior Publication Data

US 2017/0317156 A1    Nov. 2, 2017

(30) Foreign Application Priority Data

May 2, 2016    (KR) ........................ 10-2016-0054176

(51) Int. Cl.
*H01L 29/08*    (2006.01)
*H01L 35/24*    (2006.01)
(Continued)

(52) U.S. Cl.
CPC ...... *H01L 27/3272* (2013.01); *H01L 27/3262* (2013.01); *H01L 27/3276* (2013.01);
(Continued)

(58) Field of Classification Search
CPC ............ H01L 27/3272; H01L 27/3262; H01L 27/3276; H01L 2227/323; H01L 29/7869; H01L 29/78672; H01L 27/1225
See application file for complete search history.

(56) References Cited

U.S. PATENT DOCUMENTS

2002/0047568 A1*   4/2002   Koyama .............. G09G 3/2022
                                                                      315/169.3
2013/0307006 A1*   11/2013   Koshihara ............ H01L 33/405
                                                                          257/98
(Continued)

FOREIGN PATENT DOCUMENTS

KR           10-1048965       7/2011
KR           10-1444777       9/2014
KR     10-2015-0146117       12/2015

*Primary Examiner* — Victor A Mandala
(74) *Attorney, Agent, or Firm* — F. Chau & Associates, LLC

(57) ABSTRACT

An organic light emitting display (OLED) device includes an organic light emitting diode having an anode and a cathode. The organic light emitting diode is configured to receive a reference voltage. A control transistor includes a first control electrode and a first semiconductor active layer. The control transistor is configured to receive a control signal. A driving transistor includes a second control electrode that is electrically connected to the control transistor, an input electrode that is configured to receive a power voltage, an output electrode that is electrically connected to the anode of the organic light emitting diode, and a second semiconductor active layer that includes a different material from that of the first semiconductor active layer. A shielding electrode is disposed on the second semiconductor active layer, overlapping the driving transistor, and configured to receive the power voltage.

22 Claims, 18 Drawing Sheets

(51) Int. Cl.
*H01L 21/00* (2006.01)
*H01L 27/32* (2006.01)
*H01L 27/12* (2006.01)
*H01L 29/786* (2006.01)

(52) U.S. Cl.
CPC ...... *H01L 27/1225* (2013.01); *H01L 29/7869* (2013.01); *H01L 29/78672* (2013.01); *H01L 2227/323* (2013.01)

(56) References Cited

U.S. PATENT DOCUMENTS

| | | | |
|---|---|---|---|
| 2015/0243724 A1 | 8/2015 | Cho et al. | |
| 2016/0233285 A1* | 8/2016 | Lee | H01L 51/5228 |
| 2016/0247452 A1* | 8/2016 | Lee | H01L 27/3276 |
| 2016/0260792 A1* | 9/2016 | Kim | H01L 51/5209 |
| 2016/0343980 A1* | 11/2016 | Lee | H01L 51/5246 |
| 2017/0221975 A1* | 8/2017 | Lee | H01L 51/001 |

\* cited by examiner

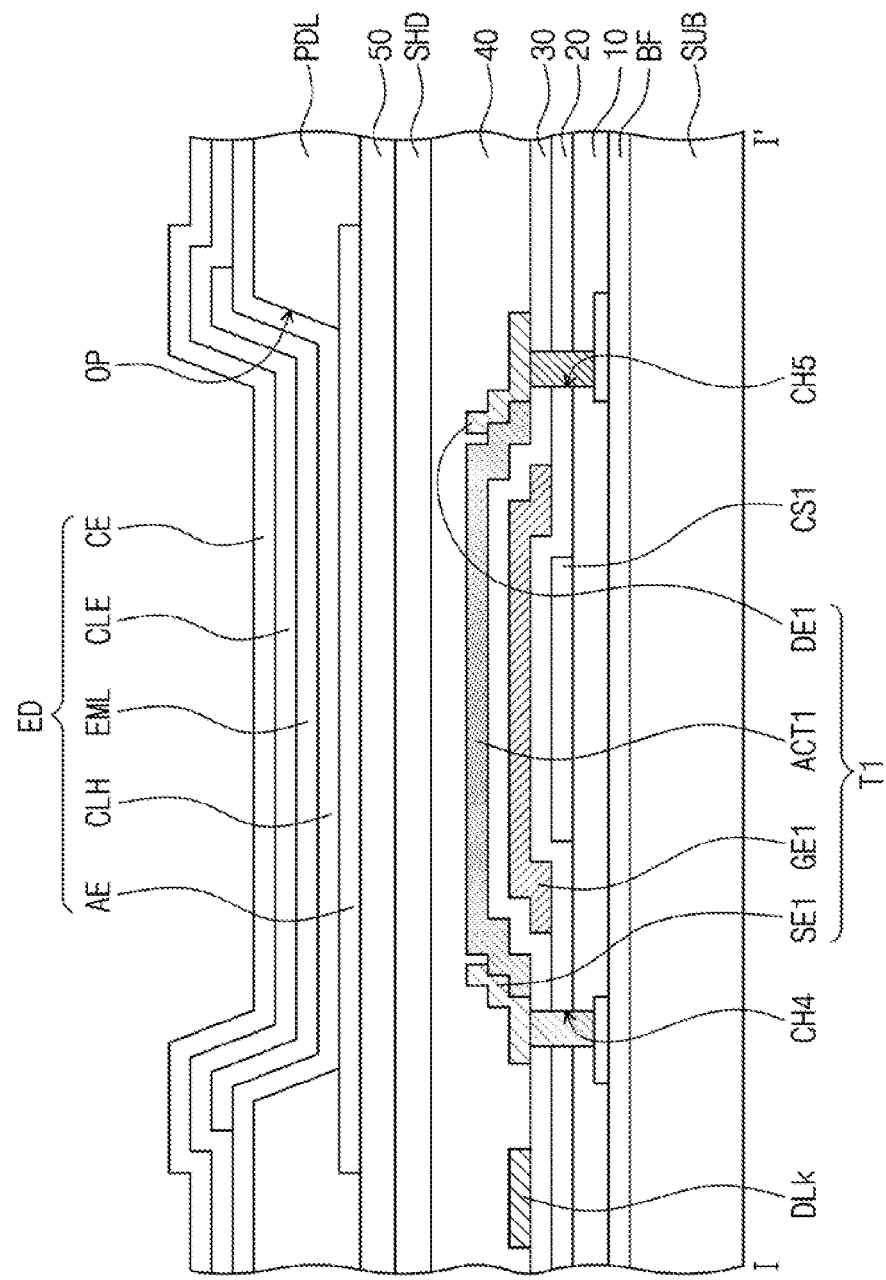

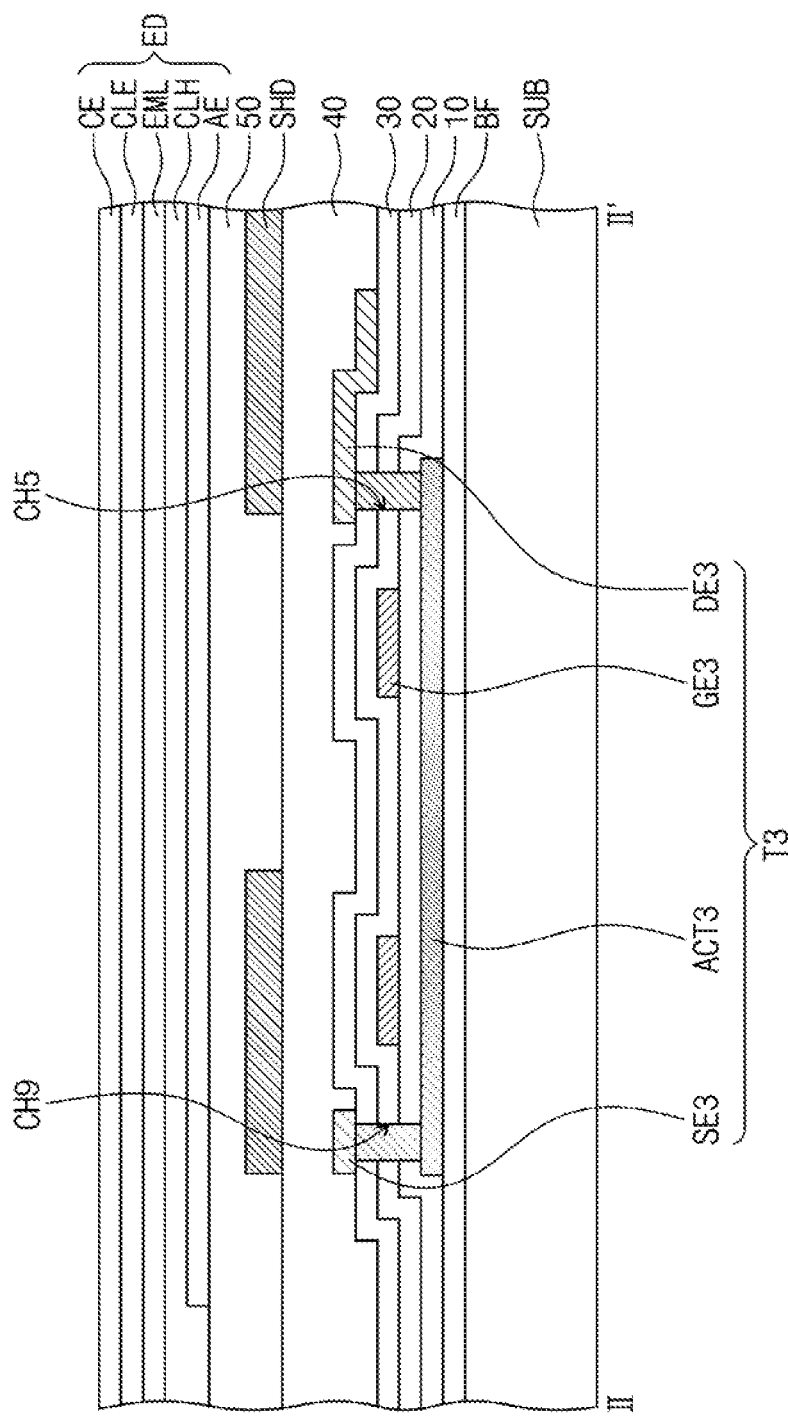

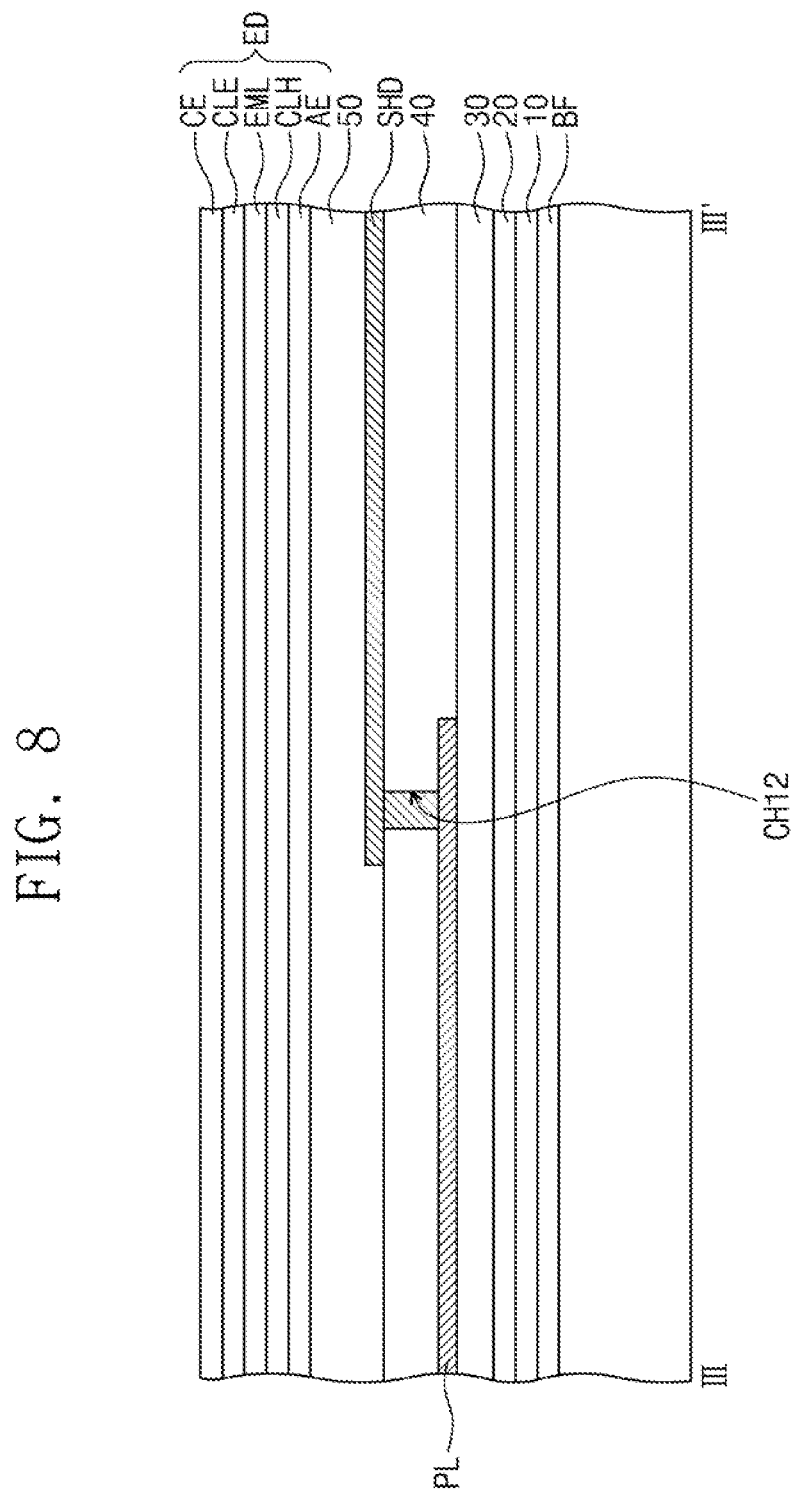

ORGANIC LIGHT EMITTING DISPLAY APPARATUS AND METHOD OF MANUFACTURING THE SAME

CROSS-REFERENCE TO RELATED APPLICATIONS

This U.S. non-provisional patent application claims priority under 35 U.S.C. § 119 to Korean Patent Application No. 10-2016-0054176, filed on May 2, 2016, in the Korean Intellectual Property Office, the entire contents of which are hereby incorporated by reference.

TECHNICAL FIELD

The present disclosure relates to a display apparatus, and in particular, to an organic light emitting display apparatus and a method of manufacturing the same.

DISCUSSION OF THE RELATED ART

An organic light emitting display apparatus includes a plurality of pixels. Each of the plurality of pixels includes an organic light emitting diode and a circuit part for controlling the organic light emitting diode. The circuit part includes a control transistor, a driving transistor, and a storage capacitor.

The organic light emitting diode includes an anode, a cathode, and an organic light emitting layer disposed between the anode and the cathode. If a voltage higher than a threshold voltage of the organic light emitting layer is applied between the anode and the cathode, light is emitted from the organic light emitting diode.

SUMMARY

An organic light emitting display (OLED) device includes an organic light emitting diode having an anode and a cathode. The organic light emitting diode is configured to receive a reference voltage. A control transistor includes a first control electrode and a first semiconductor active layer. The control transistor is configured to receive a control signal. A driving transistor includes a second control electrode that is electrically connected to the control transistor, an input electrode that is configured to receive a power voltage, an output electrode that is electrically connected to the anode of the organic light emitting diode, and a second semiconductor active layer that includes a different material from that of the first semiconductor active layer. A shielding electrode is disposed on the second semiconductor active layer, overlapping the driving transistor, and configured to receive the power voltage.

An organic light emitting display (OLED) device includes an organic light emitting diode having an anode and a cathode. The organic light emitting diode is configured to receive a reference voltage. A control transistor includes a first control electrode and a first semiconductor active layer. The first control electrode is configured to receive a control signal. The first semiconductor active layer is disposed below the first control electrode. A driving transistor includes a second control electrode, an input electrode, an output electrode, and a second semiconductor active layer. The second control electrode is electrically connected to the control transistor. The input electrode is configured to receive a power voltage. The output electrode is electrically connected to the anode of the organic light emitting diode. The second semiconductor active layer is disposed on the second control electrode. A shielding electrode is disposed on the second semiconductor active layer. The shielding electrode overlaps the driving transistor and is configured to receive the power voltage.

A method of manufacturing an organic light emitting display apparatus includes forming a first semiconductor layer on a base substrate. A first conductive layer is formed on the first semiconductor layer. A second conductive layer is formed on the first conductive layer. A second semiconductor layer is formed on the second conductive layer. A shielding electrode is formed on the second semiconductor active layer. A portion of the first semiconductor layer forms a first semiconductor active layer of a control transistor. A portion of the first conductive layer forms a first control electrode of the control transistor. A portion of the second conductive layer forms a second control electrode of a driving transistor. A portion of the second semiconductor layer forms a second semiconductor active layer of the driving transistor.

An organic light emitting display device includes an organic light emitting diode receiving a power voltage through a power line, a driving transistor including a channel region, and a shielding electrode disposed over the channel region of the driving transistor and configured to receive the power voltage.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein:

FIG. 6 is a cross-sectional view taken along line I-I' of FIG. 4;

FIG. 7 is a cross-sectional view taken along line II-II' of FIG. 4;

FIG. 8 is a cross-sectional view taken along line III-III' of FIG. 4; and

DETAILED DESCRIPTION

Figure 1:
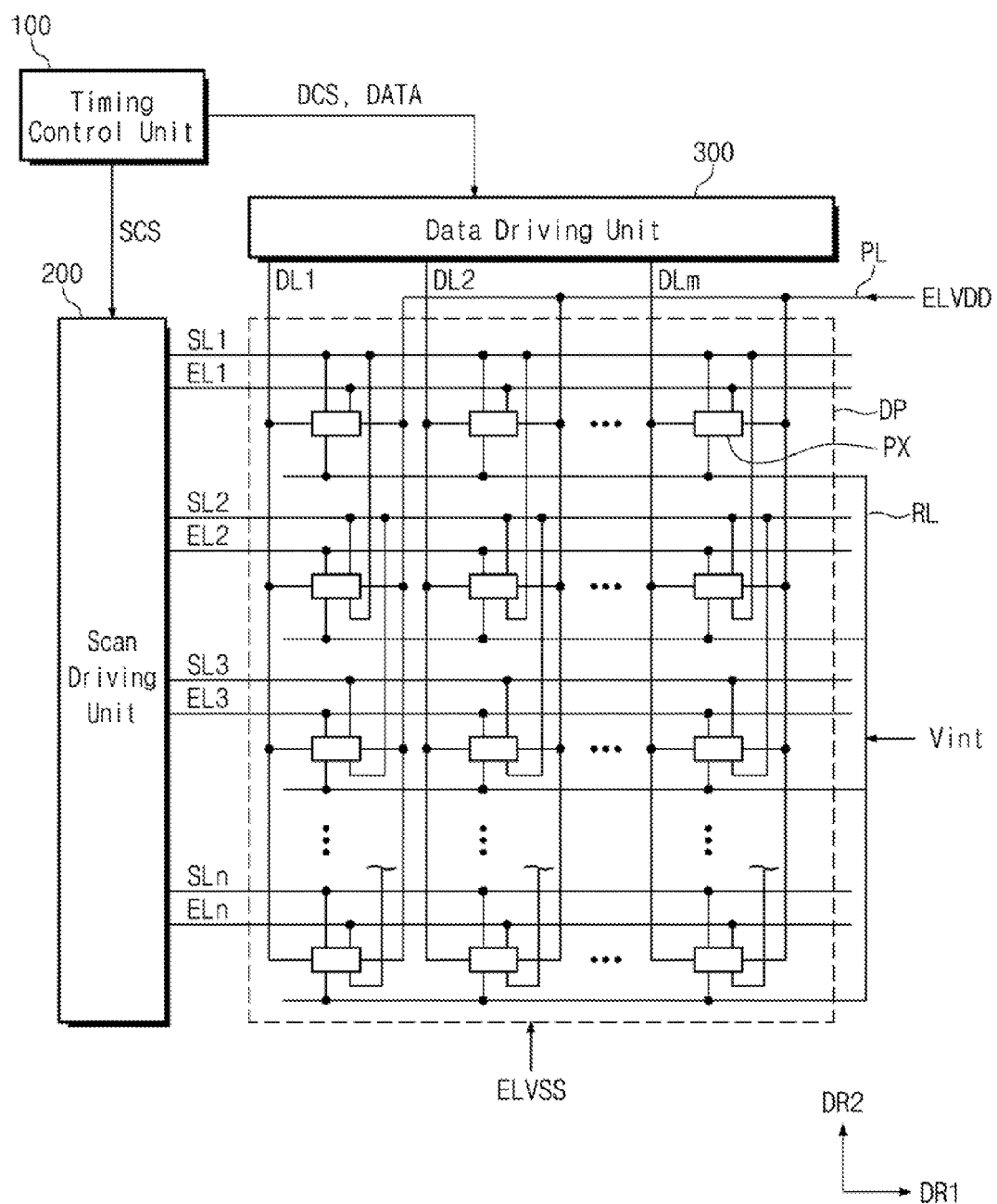
FIG. 1 is a block diagram illustrating an organic light emitting display apparatus according to exemplary embodiments of the inventive concept.

Exemplary embodiments of the inventive concepts will now be described more fully with reference to the accompanying drawings. The inventive concepts may, however, be embodied in many different forms and should not be construed as being limited to the exemplary embodiments set forth herein; rather, these embodiments are provided so that this disclosure will be thorough and complete, and will fully convey the present inventive concept to those of ordinary skill in the art. In the drawings, the thicknesses of layers and regions may be exaggerated for clarity. Like reference numerals in the may denote like elements throughout the specification and drawings.

It will be understood that when an element is referred to as being "connected" or "coupled" to another element, it can be directly connected or coupled to the other element or intervening elements may be present. FIG. 1 is a block diagram illustrating an organic light emitting display apparatus according to exemplary embodiments of the inventive concept. As shown in FIG. 1, an organic light emitting display apparatus may include a timing control unit 100, a scan driving unit 200, a data driving unit 300, and an organic light emitting display panel DP.

The timing control unit 100 may be configured to receive input image signals and convert the input image signals to image data DATA which have a data format suitable for an interface specification of the data driving unit 300. The timing control unit 100 may output the image data DATA and various control signals (e.g., data and scan control signals DCS and SCS).

The scan driving unit 200 may be configured to receive the scan control signal SCS from the timing control unit 100. The scan control signal SCS may include a vertical start signal to initiate an operation of the scan driving unit 200, a clock signal to determine when to output signals, and so forth. The scan driving unit 200 may also be configured to produce a plurality of scan signals and then to sequentially output the plurality of scan signals to a plurality of scan lines SL1, SL2, SL3, . . . SLn, to be described below. The scan driving unit 200 may also be configured to produce a plurality of light-emitting control signals in response to the scan control signal SCS and to output the plurality of light-emitting control signals to a plurality of light-emitting lines EL1, EL2, EL3, . . . ELn, to be described below.

Although FIG. 1 illustrates an example in which the plurality of scan signals and the plurality of light-emitting control signals are output from a single scan driving unit (e.g., 200), the inventive concept is not limited thereto. In some exemplary embodiments of the present inventive concept, the organic light emitting display apparatus may include a plurality of scan driving units, which are configured to divide and output a plurality of scan signals and a plurality of light-emitting control signals. Furthermore, in certain exemplary embodiments of the present inventive concept, the organic light emitting display apparatus may further include driving circuits, one of which is used to produce and output the plurality of scan signals, and another of which is used to produce and output the plurality of light-emitting control signals.

The data driving unit 300 may be configured to receive the data control signal DCS and the image data DATA from the timing control unit 100. In the data driving unit 300, the image data DATA may be converted into data signals, and then, the data signals may be output to a plurality of data lines DL1, DL2, . . . DLm to be described below. The data signals may be provided in the form of analog voltages, whose levels are determined based on gradation levels of the image data DATA.

The organic light emitting display panel DP may include the scan lines SL1-SLn, the light-emitting lines EL1-ELn, the data lines DL1-DLm, and a plurality of pixels PX. The plurality of the scan lines SL1-SLn may extend in a first direction DR1 and may be arranged in a second direction DR2 perpendicular to the first direction DR1. Each of the light-emitting lines EL1-ELn may be disposed in parallel with a corresponding one of the scan lines SL1-SLn. The data lines DL1-DLm may be disposed to cross the scan lines SL1-SLn and may be electrically disconnected from the scan lines SL1-SLn.

Each of the pixels PX may be coupled to a corresponding one of the scan lines SL1-SLn, a corresponding one of the light-emitting lines EL1-ELn, and a corresponding one of the data lines DL1-DLm. In some exemplary embodiments of the present inventive concept, a power voltage ELVDD and a reference voltage ELVSS may be applied to each of the pixels PX. Here, the reference voltage ELVSS may be lower than the power voltage ELVDD. Each of the pixels PX may be coupled to a power line PL through which the power voltage ELVDD is applied. Each of the pixels PX may be coupled to a refresh line RL, which is configured to receive an initialization voltage Vint.

Each of the pixels PX may be electrically connected to two scan lines. For example, some of the pixels PX (e.g., a second row of the pixels) connected to a second scan line SL2 may also be connected to a first scan line SL1, as shown in FIG. 1. The second row of the pixels PX may be configured to receive the scan signals that are applied to the second scan line SL2 and the first scan line SL1, respectively.

The organic light emitting display panel DP may further include a plurality of dummy scan lines and a plurality of refresh control lines. The dummy scan lines and the refresh control lines may be configured to receive signals to be applied to the scan lines SL1-SLn. The dummy scan lines and the refresh control lines may be electrically connected to each other. Each of the dummy scan lines and each of the refresh control lines may be electrically connected to a corresponding one of the scan lines SL1-SLn.

Furthermore, some of the pixels PX (e.g., a column of the pixels) connected to one of the data lines DL1-DLm may be connected to each other. In the column of the pixels PX, two pixels adjacent to each other may be electrically connected to each other.

Each of the pixels PX may include an organic light emitting diode and a circuit part for controlling light emission of the organic light emitting diode. The circuit part may include a plurality of thin-film transistors (hereinafter, transistors) and at least one capacitor. The plurality of pixels PX may include red, green, and blue pixels which are configured to emit red, green, and blue light respectively. The organic light emitting diodes of the red, green, and blue pixels may include organic light emitting layers that are formed of different materials.

A plurality of photolithography processes may be performed to form the scan lines SL1-SLn, the light-emitting lines EL1-ELn, the data lines DL1-DLm, the power line PL, the refresh line RL, and the pixels PX on a base substrate. For example, a deposition or coating process may be performed several times to form a plurality of insulating layers on the base substrate. The insulating layers may include an organic layer and/or an inorganic layer. In addition, an encapsulation layer may be formed on the base substrate to protect the pixels PX.

Figure 2:
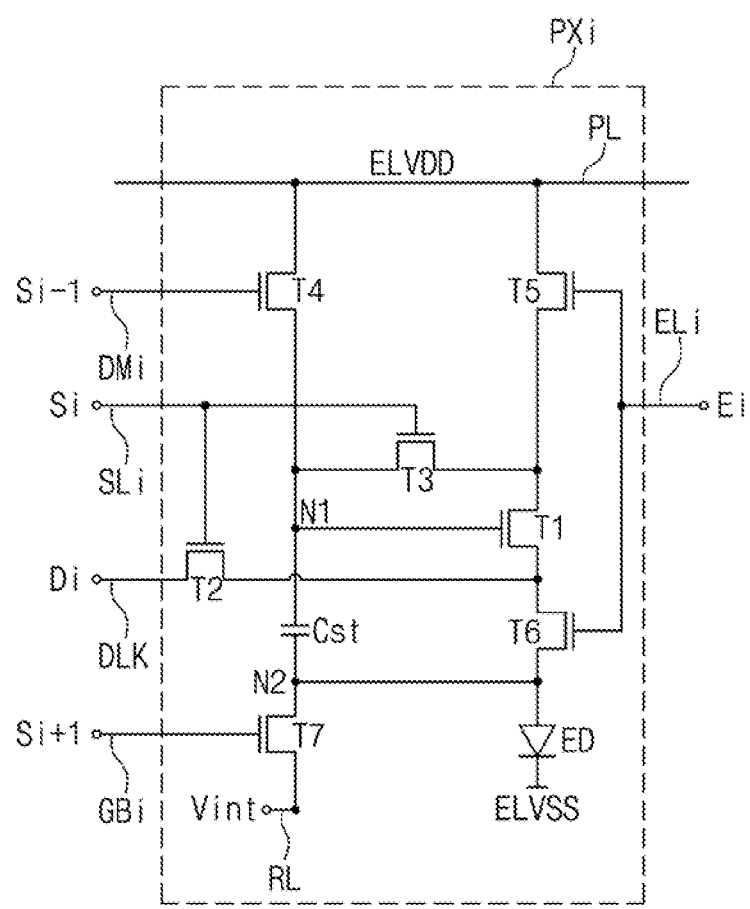
FIG. 2 is a circuit diagram illustrating a pixel according to exemplary embodiments of the inventive concept.

FIG. 2 is a circuit diagram illustrating a pixel according to exemplary embodiments of the present inventive concept.

FIG. 2 illustrates an i-th pixel PXi connected to a k-th data line DLk of the data lines DL1-DLm.

The i-th pixel PXi may include an organic light emitting diode ED and a circuit part, which controls the organic light emitting diode ED. The circuit part may include seven transistors T1, T2, T3, T4, T5, T6, and T7 and one capacitor Cst. The description that follows will refer to an example in which the seven transistors T1-T7 are p-type transistors.

However, the circuit part shown in FIG. 2 is one of various examples of the circuit part, and thus, the inventive concept is not limited thereto.

The circuit part may include a driving transistor and a control transistor.

The driving transistor may be configured to control an amount of driving current to be supplied to the organic light emitting diode ED. In some exemplary embodiments of the present inventive concept, the driving transistor may be a first transistor T1.

The control transistor may include a control terminal to which a control signal is applied. The control signal applied to the i-th pixel PXi may include an (i−1)-th scan signal Si−1, an i-th scan signal Si, a data signal Di, and an i-th light-emitting control signal Ei.

In some exemplary embodiments of the present inventive concept, the control transistor may include second to seventh transistors T2-T7. The description that follows will refer to an example in which the control transistor consists of six transistors, but the inventive concept is not limited thereto. For example, in certain embodiments, the control transistor may consist of five or fewer transistors or consist of seven or more transistors.

A node between an output terminal of the fourth transistor T4 and the control terminal of the first transistor T1 will be referred to as a first node N1, and a node between the seventh transistor T7 and the storage capacitor Cst will be referred to as a second node N2.

The first transistor T1 may include an input electrode, which is used to receive the power voltage ELVDD through the fifth transistor T5, the control electrode coupled to the first node N1, and an output electrode. The output electrode of the first transistor T1 may be used to apply the power voltage ELVDD to the organic light emitting diode ED via the sixth transistor T6. The input electrode of the first transistor T1 may be coupled to the first node N1 via the third transistor T3.

The first transistor T1 may be used to control an amount of driving current to be supplied to the organic light emitting diode ED, based on electric potential the first node N1.

The second transistor T2 may include an input electrode coupled to the k-th data line DLk, a control electrode coupled to an i-th scan line SLi, and an output electrode coupled to the output electrode of the first transistor T1. The second transistor T2 may be turned on or off, depending on a scan signal Si (e.g., i-th scan signal) applied to the i-th scan line SLi, and may be used to provide the data signal Di applied to the k-th data line DLk to the storage capacitor Cst.

The third transistor T3 may include an input electrode coupled to the input electrode of the first transistor T1, a control electrode coupled to the i-th scan line SLi, and an output electrode coupled to the first node N1. The third transistor T3 may be turned on or off by the i-th scan signal Si.

In the case where the second and third transistors T2 and T3 are turned on, the first transistor T1 may be connected to the second and third transistors T2 and T3 and diode-connected between the second and third transistors T2 and T3. Accordingly, the second transistor T2 may be coupled to the first node N1 via the first and third transistors T1 and T3.

The storage capacitor Cst may be disposed between and coupled to the first node N1 and the anode of the organic light emitting diode ED. The storage capacitor Cst may be charged to a voltage level corresponding to a voltage applied to the first node N1.

The fourth transistor T4 may include an input electrode coupled to the power line PL, a control electrode, which is used to receive the (i−1)-th scan signal Si−1, and an output electrode coupled to the first node N1. A switching operation of the fourth transistor T4 may be controlled in response to the (i−1)-th scan signal Si−1. The control electrode of the fourth transistor T4 may be coupled to an i-th dummy scan line DMi. The (i−1)-th scan signal Si−1 may be applied to the i-th dummy scan line DMi. The i-th dummy scan line DMi may be electrically connected to a scan line of the (i−1)-th pixel, which is turned on just before the i-th pixel PXi of FIG. 2 is turned on. A signal to be applied to the i-th dummy scan line DMi may be substantially the same as the scan signal to be applied to the (i−1)-th pixel.

The fifth transistor T5 may include an input electrode coupled to the power line PL, a control electrode coupled to the i-th light-emitting line ELi, and an output electrode coupled to the input electrode of the first transistor T1. A switching operation of the fifth transistor T5 may be controlled in response to the i-th light-emitting control signal Ei.

The sixth transistor T6 may include an input electrode coupled to the output electrode of the first transistor T1, a control electrode coupled to the i-th light-emitting line ELi, and an output electrode coupled to the anode of the organic light emitting diode ED. A switching operation of the sixth transistor T6 may be controlled in response to the i-th light-emitting control signal Ei to be transmitted from the i-th light-emitting line ELi.

Switching operations of the fifth and sixth transistors T5 and T6 may be controlled to selectively establish a current path between the power line PL and the organic light emitting diode ED. In certain exemplary embodiments of the present inventive concept, one of the fifth and sixth transistors T5 and T6 may be omitted.

The seventh transistor T7 may include an input electrode coupled to the refresh line RL, a control electrode, which is used to receive an (i+1)-th scan signal Si+1, and an output electrode coupled to the anode of the organic light emitting diode ED. The control electrode of the seventh transistor T7 may be coupled to an i-th refresh control line GBi. An (i+1)-th scan signal Si+1 may be applied to the i-th refresh control line GBi. The i-th refresh control line GBi may be electrically connected to a scan line of the (i+1)-th pixel, which is turned on just after the i-th pixel PXi of FIG. 2 is turned on. A signal to be applied to the i-th refresh control line GBi may be substantially the same as the scan signal to be applied to the (i+1)-th pixel.

If the fourth transistor T4 is turned on, the first node N1 may be refreshed or initialized by the power voltage ELVDD.

If the seventh transistor T7 is turned on, the second node N2 may be initialized by the initialization voltage Vint. The anode of the organic light emitting diode ED may also be initialized by the initialization voltage Vint, when the seventh transistor 17 is turned on. A potential difference between the initialization voltage Vint and the reference voltage ELVSS applied to the cathode of the organic light emitting diode ED may be lower than a light-emitting threshold voltage of the organic light emitting diode ED.

Figure 3:
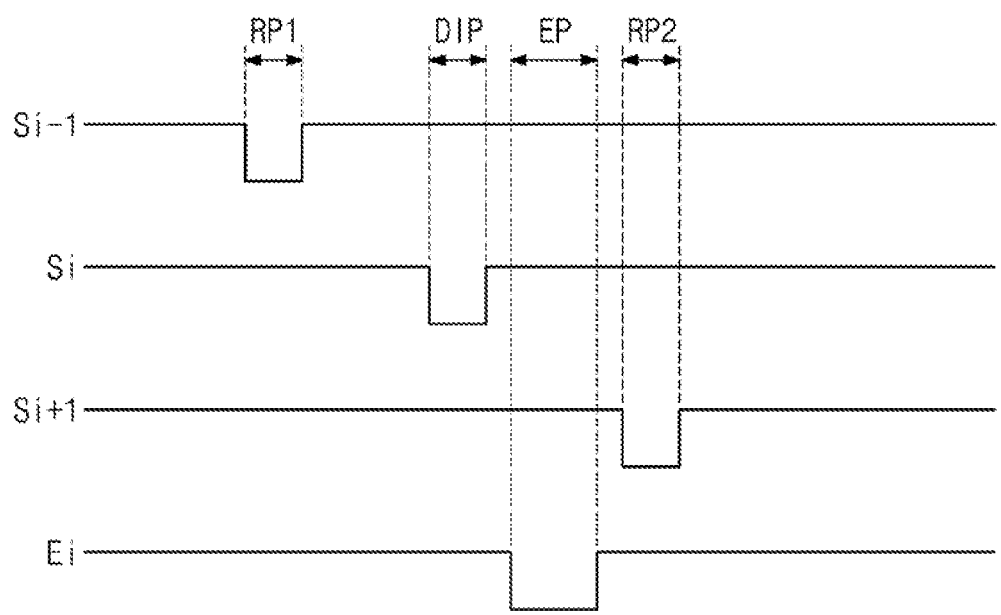
FIG. 3 is a waveform diagram illustrating driving signals for driving pixels shown in FIG. 2.

FIG. 3 is a waveform diagram illustrating driving signals for driving pixels shown in FIG. 2.

An operation of the i-th pixel will be described below in more detail with reference to FIGS. 2 and 3. The organic light emitting display panel (e.g., see DP of FIG. 1) may be configured to display an image for an interval of each frame. A plurality of scan signals applied to the scan lines SL1-SLn may be sequentially scanned for an interval of each frame. FIG. 3 illustrates a part of one of the frames.

Referring to FIGS. 2 and 3, the (i−1)-th scan signal Si−1 applied to the i-th dummy scan line DMi may be activated during a first refresh period RP1. The description of FIG. 3 will refer to an exemplary embodiment of the present inventive concept in which a signal is activated when the signal has a low level. For example, in FIG. 3, a low level of a signal may be a turn-on voltage of a transistor, to which the signal is applied.

In the case where the fourth transistor T4 is turned on by the (i−1)-th scan signal Si−1, the power voltage ELVDD may be applied to the first node N1.

The i-th scan signal Si applied to the i-th scan line SLi may be activated during a data input period DIP following the first refresh period RP1. The i-th scan signal Si, which is activated during the data input period DIP, may be used to turn on the second and third transistors T2 and T3 and may also make the first transistor T1 a diode-like element between the second and third transistors T2 and T3.

During the data input period DIP, the data signal Di may be applied to the k-th data line DLk. The data signal Di may be transmitted to the first node N1 via the second transistor T2, the first transistor T1, and the third transistor T3. Here, since the first transistor T1 is used as a diode-like element, the first node N1 may have an electric potential corresponding to a voltage difference between the data signal Di and a threshold voltage of the first transistor T1. During the data input period DIP, a voltage difference between the first node N1 and the second node N2 may be stored in the storage capacitor Cst. The second node N2 may be initialized by the initialization voltage Vint of a previous frame.

The i-th light-emitting control signal Ei may be in an inactivated state during the first refresh period RP1 and the data input period DIP and may be activated during a light-emitting period EP following the data input period DIP. The fifth and sixth transistors T5 and T6 may be turned on by the i-th light-emitting control signal Ei, and the voltage stored in the storage capacitor Cst may be applied to a control electrode of the first transistor T1.

The i-th light-emitting control signal Ei may be used to form a current path between the power line PL and the organic light emitting diode ED. Accordingly, during the light-emitting period EP, light may be emitted from the organic light emitting diode ED. The organic light emitting diode ED may have brightness that depends on the voltage stored in the storage capacitor Cst.

The (i+1)-th scan signal Si+1 may be activated during a second refresh period RP2 following the light-emitting period EP. In the case where the seventh transistor T7 is turned on by the (i+1)-th scan signal Si+1, the initialization voltage Vint may be applied to the second node N2, and thus, the anode of the organic light emitting diode ED may be initialized to the initialization voltage Vint. Light emission from the organic light emitting diode ED may be stopped during the second refresh period RP2.

Although, in FIG. 3, gaps are illustrated between the first refresh period RP1, the data input period DIP, the light-emitting period EP, and the second refresh period RP2, this is just one exemplary embodiment of the present inventive concept. In various other embodiments, the first refresh period RP1, the data input period DIP, the light-emitting period EP, and the second refresh period RP2 may be repeated without gaps therebetween.

Figure 4:
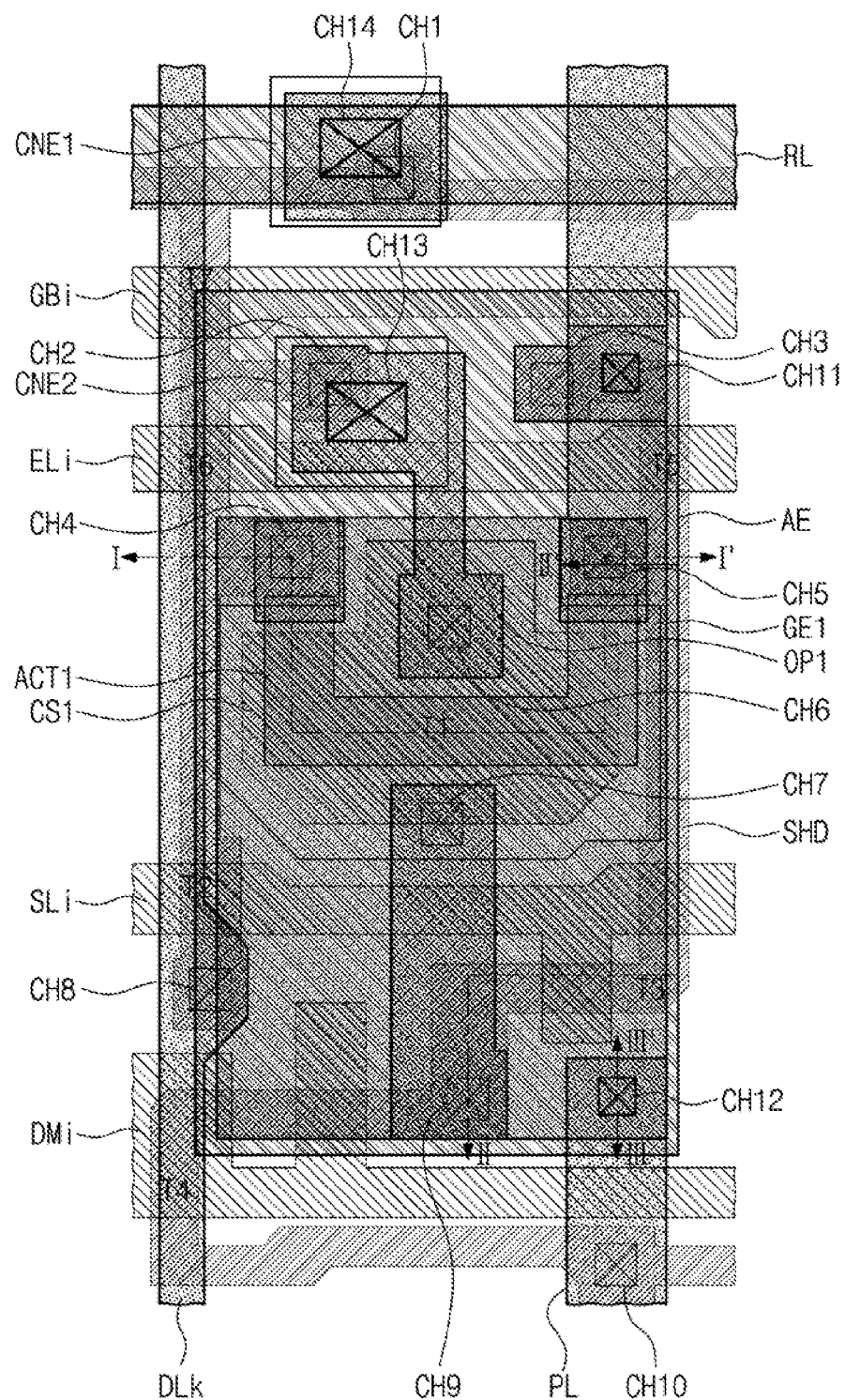
FIG. 4 is a diagram illustrating an i-th pixel according to exemplary embodiments of the inventive concept.

FIG. 4 is a layout of an i-th pixel, according to an exemplary embodiment of the present inventive concept. FIGS. 5A to 5J are plan views illustrating layers to be formed by a process of manufacturing the i-th pixel shown in FIG. 4. FIG. 6 is a sectional view taken along line I-I' of FIG. 4. FIG. 7 is a sectional view taken along line II-II' of FIG. 4. FIG. 8 is a sectional view taken along line III-III' of FIG. 4.

Referring to FIGS. 2 and 4, an organic light emitting diode ED, first to seventh transistors T1-T7, and a storage capacitor Cst may be disposed on a base substrate (e.g., SUB of FIG. 6). In some exemplary embodiments of the present inventive concept, a dummy scan line DMi, a refresh control line GBi, a scan line SLi, a light-emitting line ELi, a data line DLk, and a power line PL may be disposed on the base substrate SUB.

Referring to FIG. 5A and FIGS. 6 to 8, a buffer layer BF may be disposed on the base substrate SUB. The buffer layer BF may be formed of or may otherwise include inorganic and/or organic materials. For example, the buffer layer BF may be formed of or may otherwise include silicon nitride and/or silicon oxide.

A first semiconductor layer AL1 may be formed on the buffer layer BF. A portion of the first semiconductor layer AL1 may be used as a channel region of at least one of the second to seventh transistors T2-T7. For example, a portion of the first semiconductor layer AL1 may be used as a semiconductor active layer ACT3 of the third transistor T3.

The formation of the first semiconductor layer AL1 may include a photolithography process. In addition, the formation of the first semiconductor layer AL1 may include a doping or reduction process.

The first semiconductor layer AL1 may be formed of or may otherwise include poly silicon. Accordingly, the channel regions of the second to seventh transistors T2-T7 may be formed of or may otherwise include poly silicon. This will be described in more detail below.

A first insulating layer 10 may be disposed on the first semiconductor layer AL1. The first insulating layer 10 may be formed of or may otherwise include inorganic and/or organic materials. For example, the first insulating layer 10 may be formed of or may otherwise include silicon nitride and/or silicon oxide.

Referring to FIG. 5B and FIGS. 6 to 8, a first conductive layer may be formed on the first insulating layer 10. The first conductive layer may have portions which are used as a first electrode CS1 of the storage capacitor Cst and control electrodes of the second to seventh transistors T2-T7. In addition, the first conductive layer may include other portions which are used as the dummy scan line DMi, the scan line SLi, the light-emitting line ELi, and the refresh control line GBi. A portion of the dummy scan line DMi may serve as the control electrode of the fourth transistor T4. Portions of the scan line SLi may serve as the control electrodes of the second and third transistors T2 and T3. Portions of the light-emitting line ELi may serve as the control electrodes of the fifth and sixth transistors T5 and T6. A portion of the refresh control line GBi may serve as the control electrode of the seventh transistor T7.

A second insulating layer 20 may be disposed on the first conductive layer. The second insulating layer 20 may be formed of or may otherwise include inorganic and/or organic materials. For example, the second insulating layer 20 may be formed of or may otherwise include silicon nitride and/or silicon oxide.

Referring to FIG. 5C and FIGS. 6 to 8, a second conductive layer may be disposed on the second insulating layer 20. The second conductive layer may include a portion which is used as a control electrode GE1 of the first transistor T1. The control electrode GE1 of the first transistor T1 may serve as a second electrode of the storage capacitor Cst. The control electrode GE1 of the first transistor T1 may have an opening OP1 therein. The opening OP1 may prevent the control electrode of the first transistor T1 from being electrically connected to the first electrode CS1 of the storage capacitor Cst, when the seventh transistor T7 and the first electrode CS1 of the storage capacitor Cst are connected to each other through a sixth contact hole CH6 (e.g., see FIG. 6E) in a subsequent process.

A third insulating layer 30 may be disposed on the second conductive layer. The third insulating layer 30 may be formed of or may otherwise include inorganic and/or organic materials. For example, the third insulating layer 30 may be formed of or may otherwise include silicon nitride and/or silicon oxide.

Referring to FIG. 5D and FIGS. 6 to 8, a second semiconductor layer may be disposed on the third insulating layer 30. The second semiconductor layer may include a semiconductor active layer ACT1 of the first transistor T1, a first connection electrode CNE1, and a second connection electrode CNE2. The first connection electrode CNE1 may be overlapped with the input electrode of the seventh transistor T7. The first connection electrode CNE1 may be connected to a refresh line RL and the input electrode of the seventh transistor T7, respectively, in a subsequent process. The second connection electrode CNE2 may be overlapped with the output electrode of the seventh transistor T7. The second connection electrode CNE2 may be connected to the anode of the organic light emitting diode ED and the output electrode of the seventh transistor T7, respectively, in a subsequent process.

The formation of the second semiconductor layer may include a photolithography process. In addition, the formation of the second semiconductor layer may include a doping or reduction process.

The second semiconductor layer may be formed of or may otherwise include an oxide semiconductor material. The oxide semiconductor material may include, for example, metal oxides of zinc (Zn), indium (In), gallium (Ga), tin (Sn), and titanium (Ti) or mixtures of metals (e.g., zinc (Zn), indium (In), gallium (Ga), tin (Sn), and titanium (Ti)) and/or oxides thereof. A metal may be reduced from the metal oxide semiconductor, and such a metal may be included in the electrodes and the lines. However, the metal might not be present in the channel regions.

Referring to FIG. 5E and FIGS. 6 to 8, contact holes CH1, CH2, CH3, CH4, CH5, CH6, CH7, CH8, CH9, and CH10 may penetrate at least the third insulating layer 30. The contact holes CH1-CH10 may penetrate at least one of the first to third insulating layers 10-30.

A first contact hole CHI may penetrate the first to third insulating layers 10-30 and may be disposed at a region, where the input electrode of the seventh transistor T7 will be formed. A second contact hole CH2 may penetrate the first to third insulating layers 10-30 and may be disposed at a region where the output electrode of the seventh transistor T7 will be formed. A third contact hole CH3 may penetrate the first to third insulating layers 10-30 and may be disposed at a region where the input electrode of the fifth transistor T5 will be formed. A fourth contact hole CH4 may penetrate the first to third insulating layers 10-30 and may be disposed at a region where the output electrode of the first transistor T1 will be formed. A fifth contact hole CH5 may penetrate the first to third insulating layers 10-30 and may be disposed at a region where the input electrode of the first transistor T1 will be formed. A sixth contact hole CH6 may penetrate the second to third insulating layers 20-30 and to expose the first electrode CSI of the storage capacitor Cst. A seventh contact hole CH7 may penetrate the third insulating layer 30 and may expose the control electrode of the first transistor T1. An eighth contact hole CH8 may penetrate the first to third insulating layers 10-30 and may be disposed at a region where the input electrode of the second transistor T2 will be formed. A ninth contact hole CH9 may penetrate the first to third insulating layers 10-30 and may be disposed at a region where the output electrode of the third transistor T3 will be formed. A tenth contact hole CH10 may penetrate the first to third insulating layers 10-30 and may be disposed at a region where the input electrode of the fourth transistor T4 will be formed.

Referring to FIG. 5F and FIGS. 6 to 8, a third conductive layer may be disposed on the third insulating layer 30.

The third conductive layer may include the data line DLk, the power line PL, and the input and output electrodes of the first to seventh transistors T1-T7.

The third conductive layer may be formed of or may otherwise include a metal. Although the third conductive layer is illustrated to be a single layer, the inventive concept is not limited thereto. For example, the third conductive layer may include two or more metal layers. As an example, the third conductive layer may have a triple layer structure including a Ti-containing first layer, an Al-containing second layer, and a Ti-containing third layer, which are sequentially stacked on the third insulating layer 30.

The input electrode of the fifth transistor T5 may be connected to the power line PL through the third contact hole CH3. The third conductive layer overlapped with the fourth contact hole CH4 may be used as the output electrode of the first transistor T1. The third conductive layer overlapped with the fifth contact hole CH5 may be used as the input electrode of the first transistor T1. The third conductive layer overlapped with the sixth contact hole CH6 may be connected to the first electrode CS1 of the storage capacitor Cst. The third conductive layer overlapped with the seventh contact hole CH7 may be connected to the control electrode of the first transistor T1. The data line DLk may be connected to the input electrode of the second transistor T2 through the eighth contact hole CH8. The third conductive layer overlapped with the ninth contact hole CH9 may be used as the output electrode of the fourth transistor T4. The power line PL may be connected to the fourth transistor T4 through the tenth contact hole CH10.

A fourth insulating layer 40 may be disposed on the third conductive layer. The fourth insulating layer 40 may be formed of or may otherwise include inorganic and/or organic materials. For example, the fourth insulating layer 40 may be formed of or may otherwise include silicon nitride and/or silicon oxide. The fourth insulating layer 40 may have a flat surface.

Referring to FIG. 5G and FIGS. 6 to 8, a plurality of contact holes may penetrate the fourth insulating layer 40. For example, an eleventh contact hole CH11 and a twelfth contact hole CH12 may penetrate the fourth insulating layer 40.

In some exemplary embodiments of the present inventive concept, the eleventh and twelfth contact holes CH11 and CH12 may expose at least a portion of the power line PL.

Referring to FIG. 5H and FIGS. 6 to 8, a shielding electrode SHD may be disposed on the fourth insulating layer 40.

When viewed in a plan view, the shielding electrode SHD may cover the channel region and the control electrode GE1 of the first transistor T1.

The shielding electrode SHD may be formed of or may otherwise include a metallic material. Although the third conductive layer is illustrated to be a single layer, the inventive concept is not limited thereto. For example, the third conductive layer may include two or more metal layers. As an example, the third conductive layer may have a triple layer structure including a Ti-containing first layer, an Al-containing second layer, and a Ti-containing third layer, which are sequentially stacked on the fourth insulating layer 40.

The shielding electrode SHD may have the same material and the same structure as the third conductive layer. For example, in the case where the third conductive layer has a single layered structure, the shielding electrode SHD may also have a single layered structure. In the case where the third conductive layer has a triple layered structure of Ti/Al/Ti, the shielding electrode SHD may also have a triple layered structure of Ti/Al/Ti.

The shielding electrode SHD may be connected to the power line PL through the eleventh contact hole CHI 1 and the twelfth contact hole CH12. The shielding electrode SHD may be applied with a constant power voltage ELVDD.

The shielding electrode SHD will be described in more detail below.

A fifth insulating layer 50 may be disposed on the fourth insulating layer 40 which is covered with the shielding electrode SHD. The fifth insulating layer 50 may be formed of or may otherwise include inorganic and/or organic materials. For example, the fifth insulating layer 50 may be formed of or may otherwise include silicon nitride and/or silicon oxide.

Referring to FIG. 5I and FIGS. 6 to 8, a plurality of contact holes CH13 and CH14 may penetrate at least the fifth insulating layer 50. For example, the contact holes CH13 and CH14 may penetrate the fourth insulating layer 40 and the fifth insulating layer 50.

A fourth conductive layer may be disposed on the fifth insulating layer 50. The fourth conductive layer may include an anode AE and the refresh line RL.

The anode AE may be connected to the input electrode of the sixth transistor T6 through a thirteenth contact hole CH13. The refresh line RL may be connected to the input electrode of the seventh transistor T7 through a fourteenth contact hole CH14.

Referring to FIG. 5J and FIGS. 6 to 8, a pixel defining layer PDL may be disposed on the fifth insulating layer 50. An opening OP exposing the anode AE may be defined in the pixel defining layer PDL. An organic light emitting layer EML may be disposed on the anode AE and may be overlapped with the opening OP. A cathode CE may be disposed on the organic light emitting layer EML.

A first common layer CLH may be disposed between the anode AE and the organic light emitting layer EML. A second common layer CLE may be disposed between the organic light emitting layer EML and the cathode CE. The first common layer CLH and the second common layer CLE may be disposed on a plurality of the pixels PX (e.g., of FIG. 1). The cathode CE may also be disposed on the plurality of pixels PX. In some exemplary embodiments of the present inventive concept, at least one of the first and second common layers CLH and CLE may be omitted.

The first common layer CLH may include a hole injection layer, and the second common layer CLE may include an electron injection layer. The first common layer CLH may further include a hole transport layer interposed between the hole injection layer and the organic light emitting layer EML. The second common layer CLE may further include an electron transport layer interposed between the electron injection layer and the organic light emitting layer EML.

Each of the first and second common layers CLH and CLE may further include at least one functional layer.

Although not shown, an encapsulation layer may be disposed on the cathode CE to cover the organic light emitting diode ED. The encapsulation layer may be formed of or may otherwise include an organic layer and/or an inorganic layer.

Hereinafter, the driving transistor and the control transistor will be compared with reference to FIGS. 6 and 7.

The control transistor may have substantially the same layer structure as the third transistor T3 shown in FIG. 7, and thus, the third transistor T3 of FIG. 7 will be described as an example of the control transistor.

The control electrode GE1 of the first transistor T1 may be disposed at a level different from that of the control electrode GE3 of the third transistor T3. For example, the control electrode GE1 of the first transistor T1 may be disposed at a higher level than that of the control electrode GE3 of the third transistor T3. The control electrode GE3 of the third transistor T3 may be disposed at the same level as those of the dummy scan line DMi, the scan line SLi, the light-emitting line ELi, and the refresh control line GBi.

The semiconductor active layer ACT1 of the first transistor T1 may be disposed on the control electrode GE1. The semiconductor active layer ACT1 of the first transistor T1 may be used as a portion of the second semiconductor layer AL2 shown in FIG. 5D. The first transistor T1 may have a top-gate structure.

The first transistor T1 may include an input electrode SE1 and an output electrode DE1 which are disposed on the third insulating layer 30.

The semiconductor active layer ACT1 of the first transistor T1 may be formed of or may otherwise include an oxide semiconductor material. The oxide semiconductor material may be the same as that previously described with reference to FIG. 5D.

The semiconductor active layer ACT3 of the third transistor T3 may be disposed below the control electrode GE3. The semiconductor active layer ACT3 of the third transistor T3 may be defined as a portion of the first semiconductor layer AL1 shown in FIG. 5A. The third transistor T3 may have a bottom-gate structure.

The third transistor T3 may include an input electrode SE3 and an output electrode DE3 which are disposed on the third insulating layer 30.

The semiconductor active layer ACT3 of the third transistor T3 may be formed of or may otherwise include poly silicon.

The shielding electrode SHD may be disposed to cover the channel region of the first transistor T1. In the case where an oxide semiconductor material is exposed to external light, electric characteristics of the oxide semiconductor material may be deteriorated. Accordingly, the proper performance of the first transistor T1 may be deteriorated (e.g., a shifted threshold voltage), because the channel region of the first transistor T1 includes an oxide semiconductor material.

The shielding electrode SHD may be disposed on the third conductive layer and may be used to prevent external light from being incident into the channel region of the first transistor T1.

In an organic light emitting display apparatus, according to some exemplary embodiments of the present inventive concept, light may be prevented from being incident into an oxide semiconductor, which is disposed on the control electrode of the first transistor T1, and a variation in threshold voltage of the first transistor T1 may be prevented from being increased. Accordingly, the first transistor T1 may operate more reliably. As a result, a display quality of the organic light emitting display apparatus may be increased.

The channel region of the first transistor T1 may be disposed on the control electrode. Accordingly, in the case where a voltage is applied to electrodes (e.g., the anode of the organic light emitting diode ED or the refresh line RL) disposed on the first transistor T1, the voltage may be an undesired gate voltage. In addition, in the case where there is a voltage applied to the electrodes disposed on the first transistor T1, the channel region of the first transistor T1 may suffer from a coupling phenomenon.

In an organic light emitting display apparatus, according to some exemplary embodiments of the present inventive concept, the shielding electrode SHD may be configured to receive the power voltage ELVDD, and this may make it possible to prevent the channel region of the first transistor T1 from being affected by a voltage, which is applied to an electrode disposed on the shielding electrode SHD. Accordingly, the first transistor T1 may operate more reliably. As a result, a display quality of the organic light emitting display apparatus may be increased.

Figure 9:
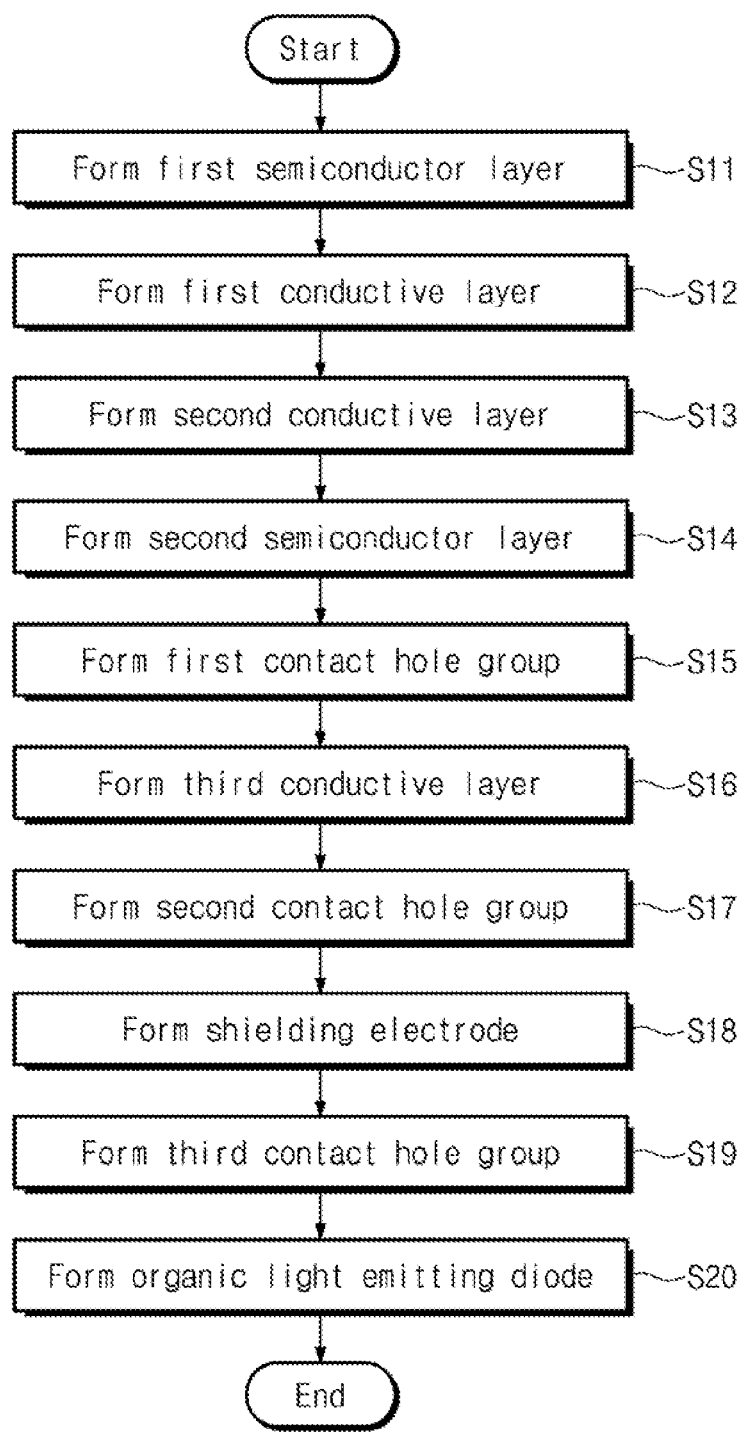
FIG. 9 is a flow chart illustrating a method of manufacturing an organic light emitting display apparatus, according to exemplary embodiments of the inventive concept.

FIG. 9 is a flow chart illustrating a method of manufacturing an organic light emitting display apparatus, according to exemplary embodiments of the present inventive concept.

A method of manufacturing an organic light emitting display apparatus will be described with reference to FIG. 9 and FIGS. 5A to 5J.

Figure 5A:
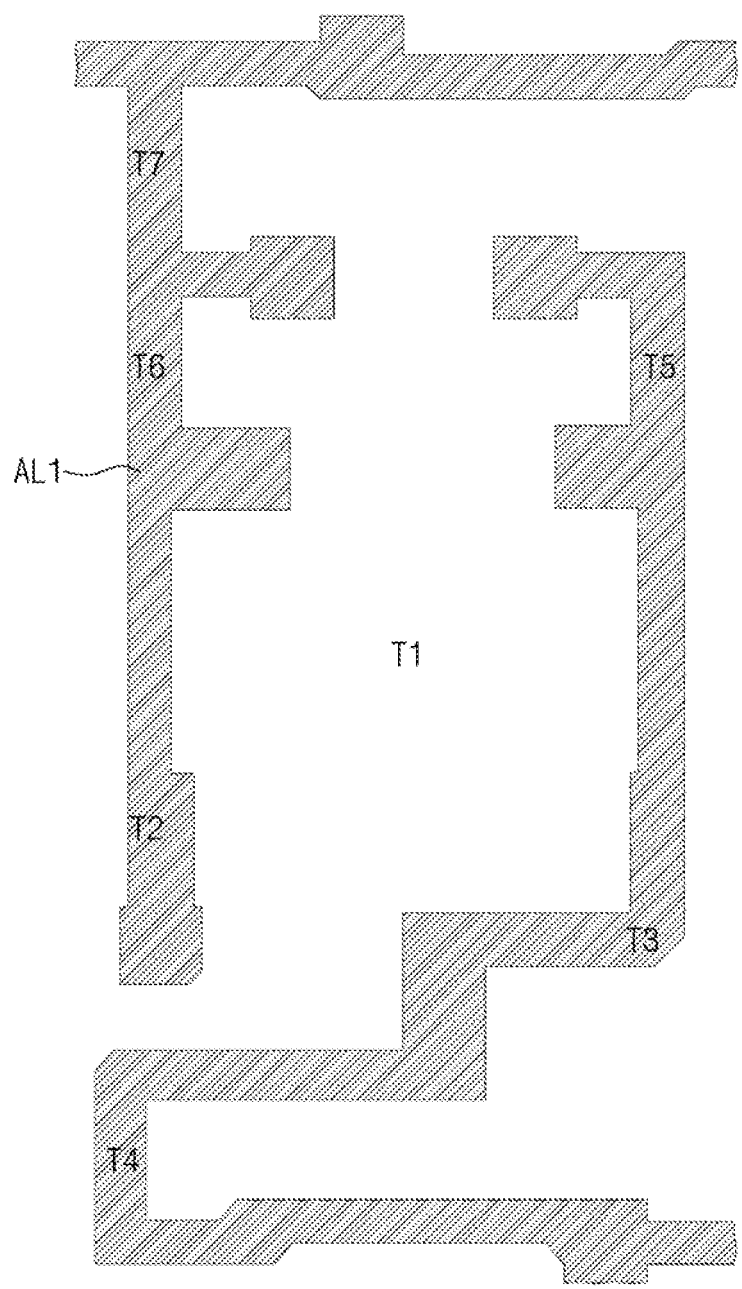
FIGS. 5A to 5J are plan views illustrating layers to be formed by a process of manufacturing the i-th pixel shown in FIG. 4.
Figure 5B:
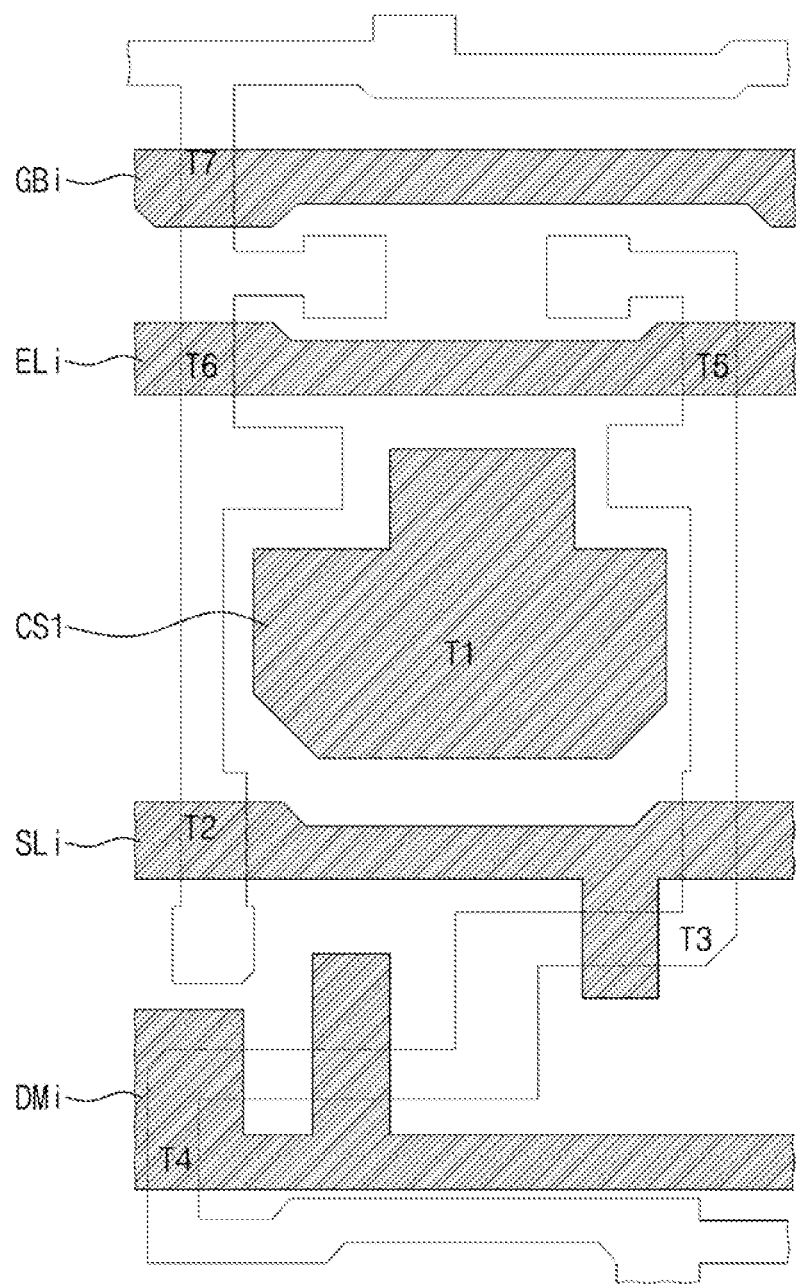
Figure 5C:
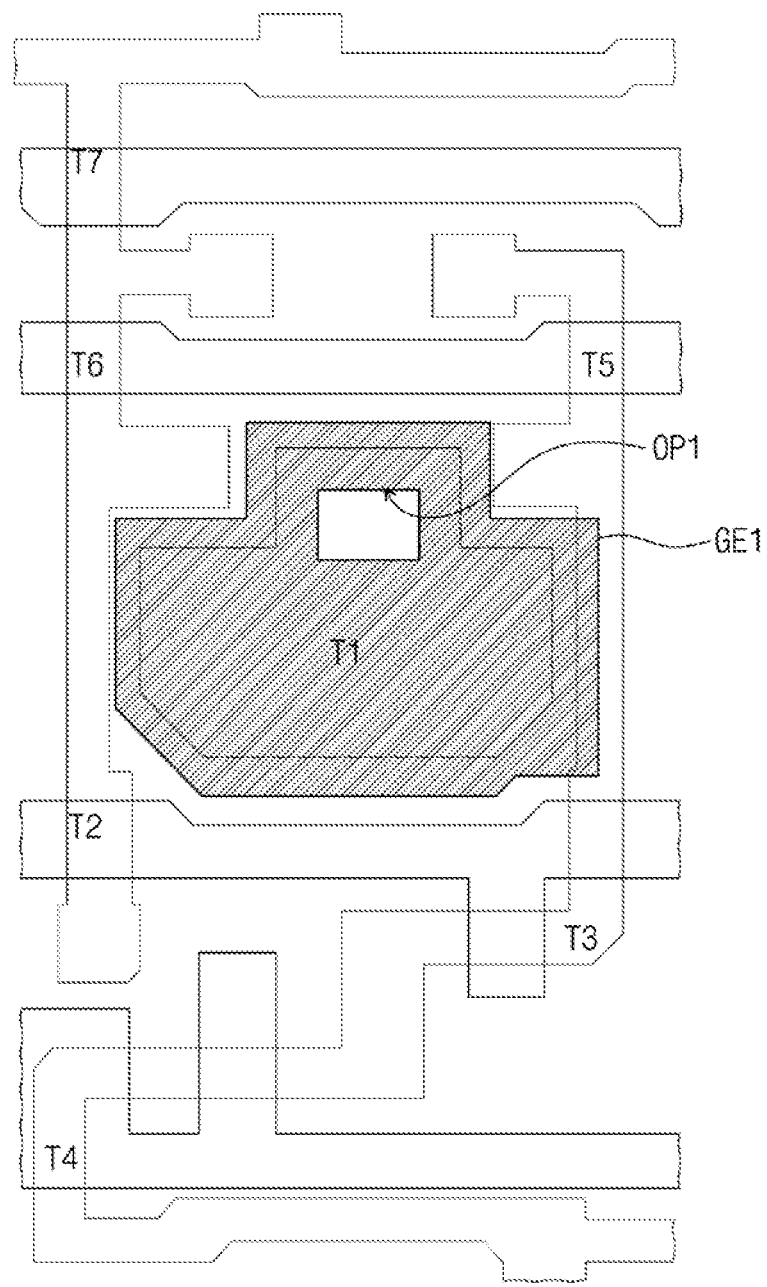
Figure 5D:
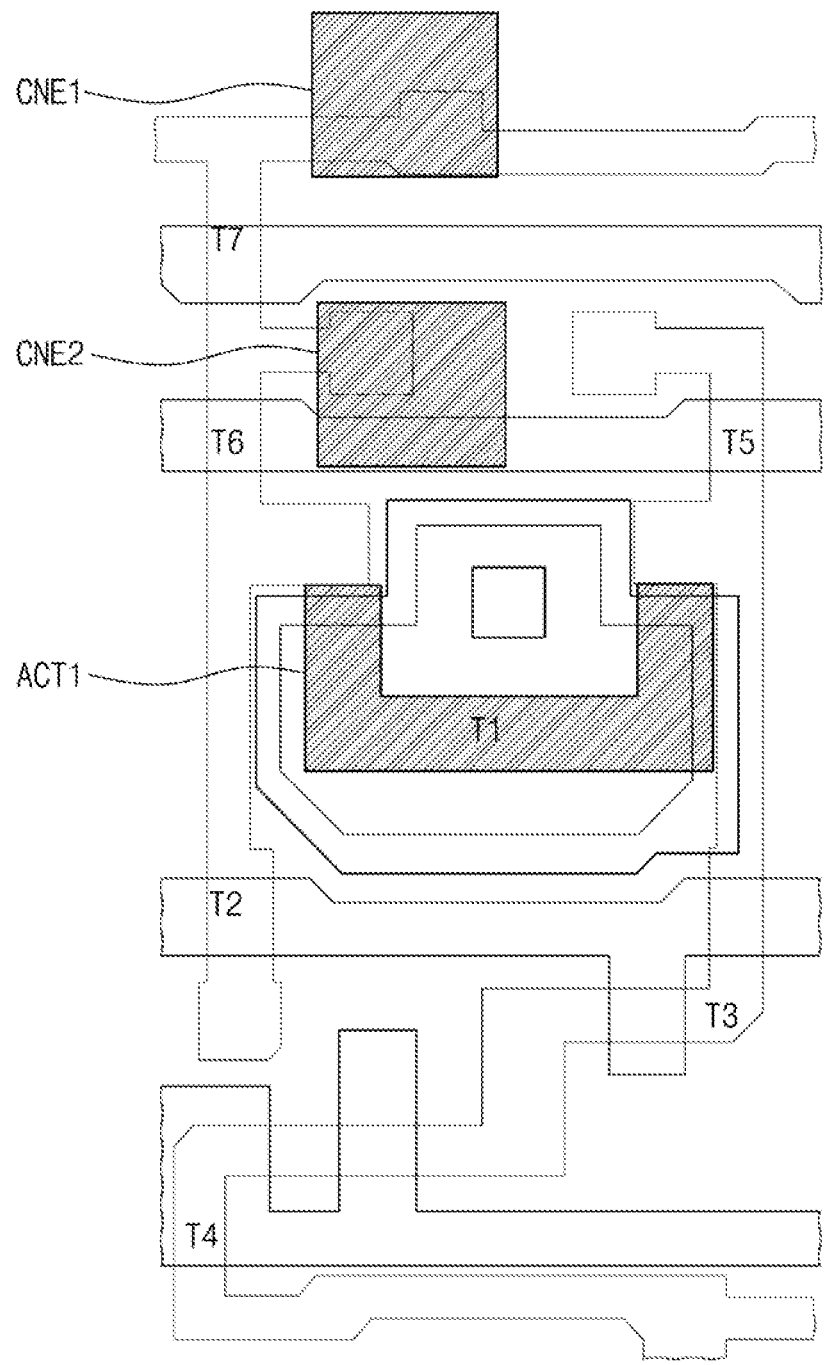
Figure 5E:
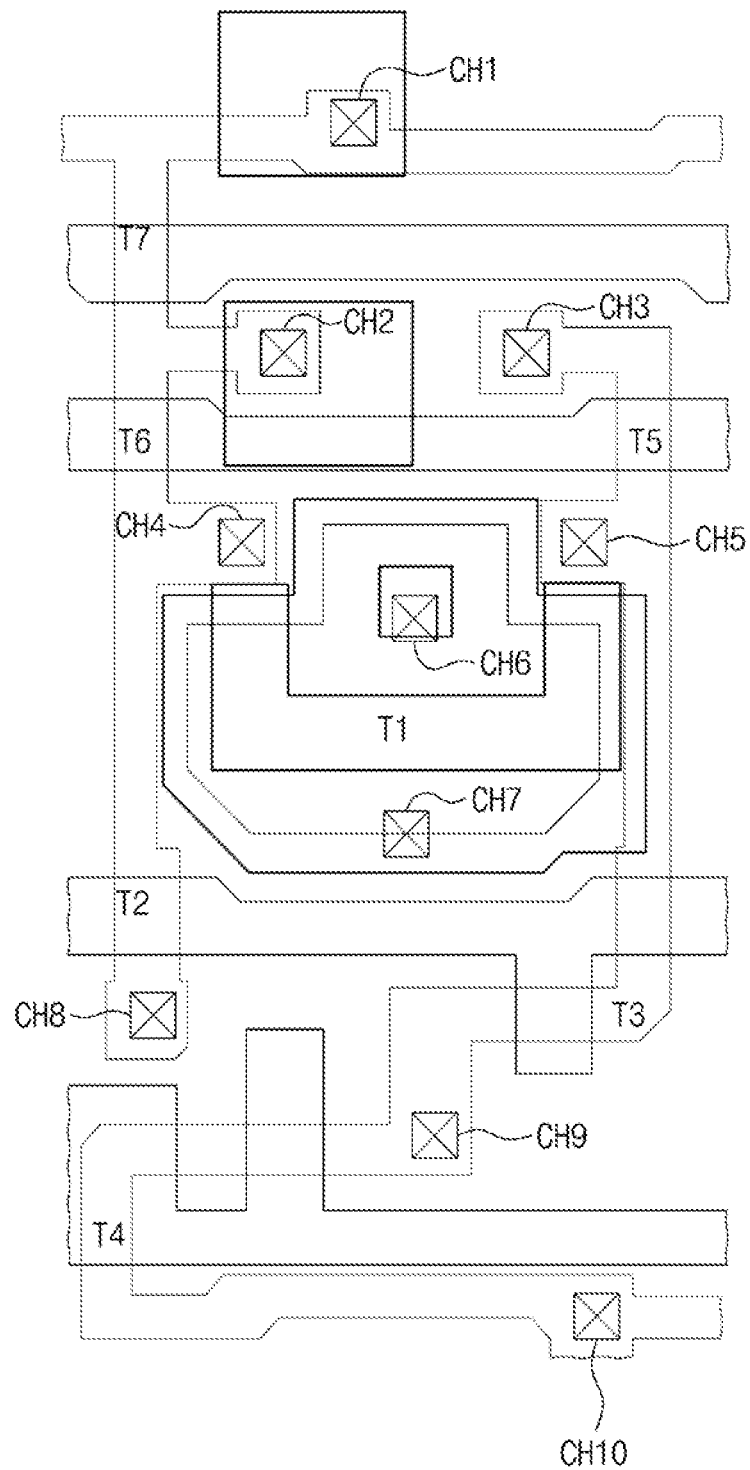
Figure 5F:
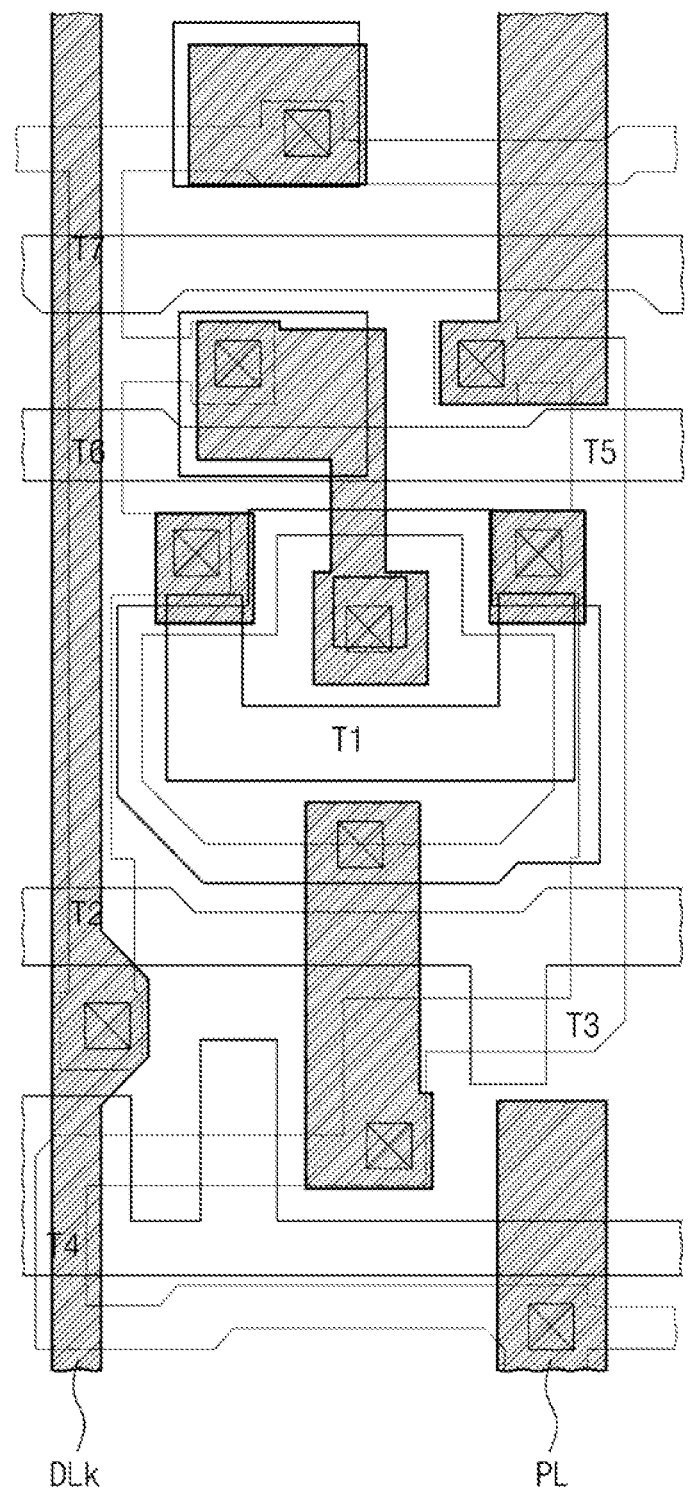
Figure 5G:
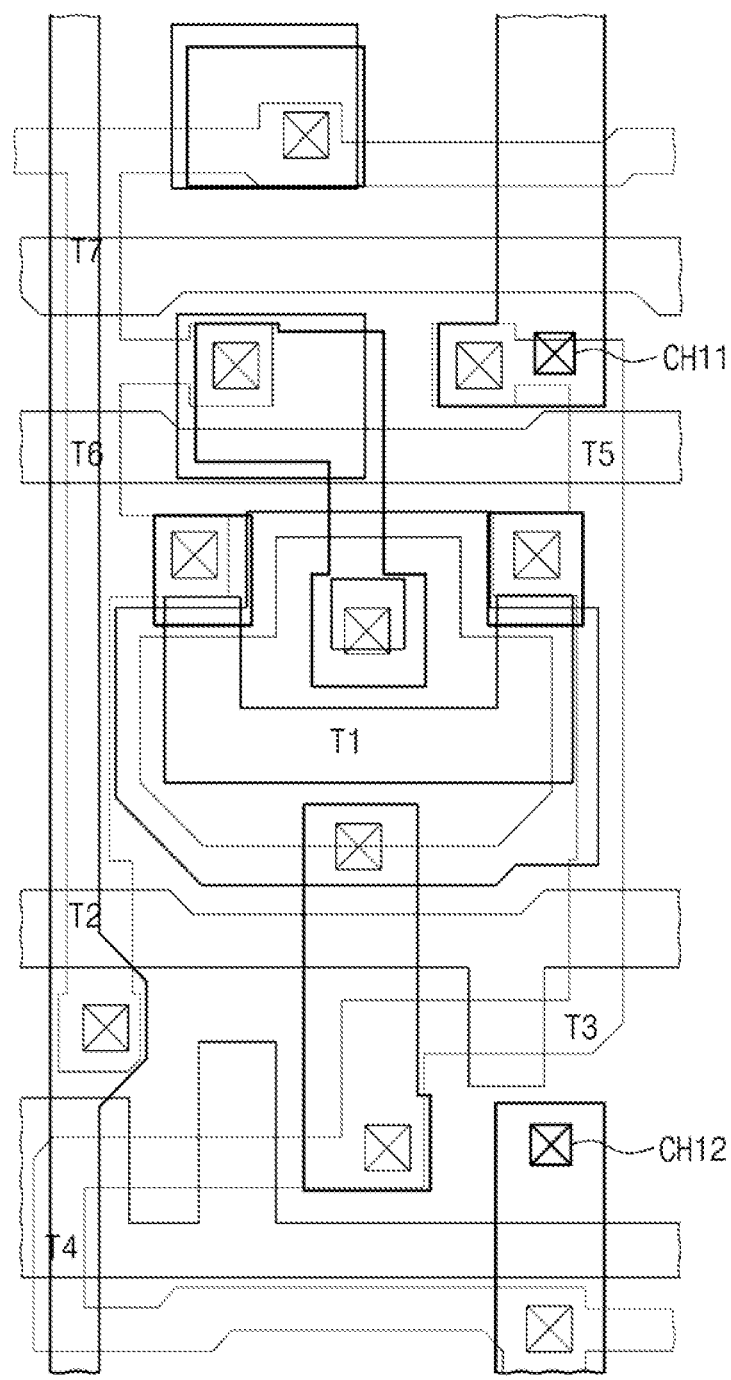
Figure 5H:
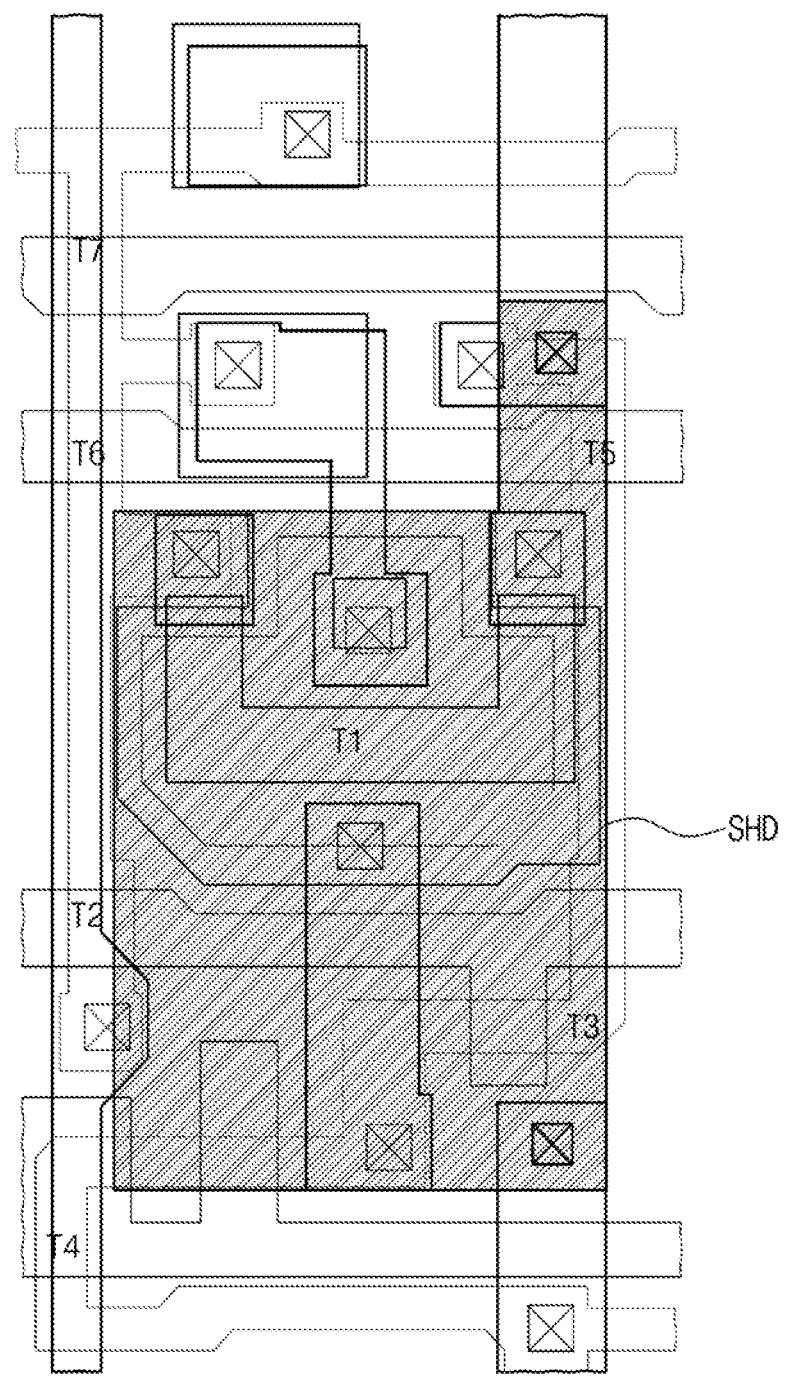
Figure 5I:
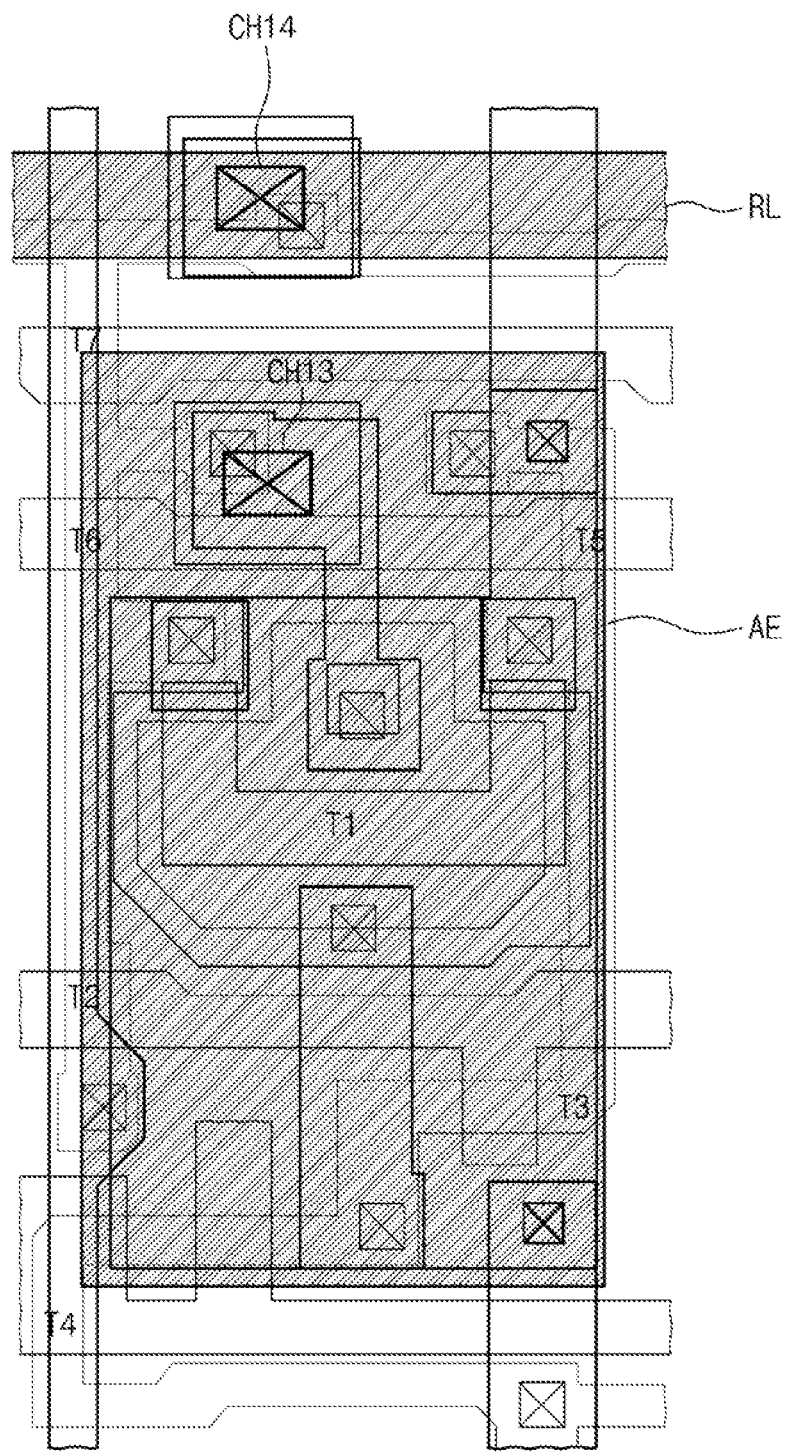
Figure 5J:
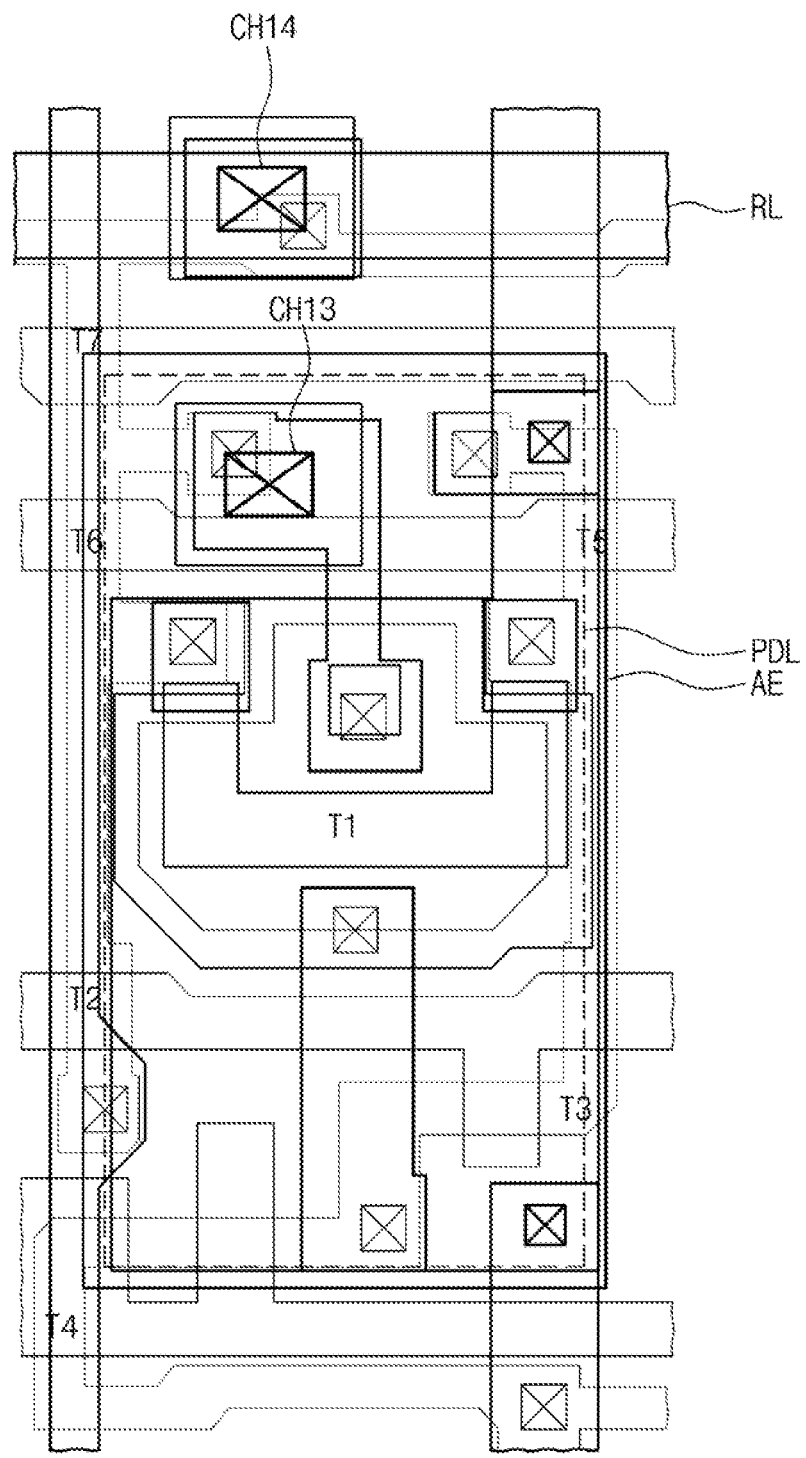

Referring to FIG. 5A, a first semiconductor layer AL1 may be formed on a substrate SUB (Step S11). Next, a first insulating layer 10 may be formed on the first semiconductor layer AL1. Referring to FIG. 5B, a first conductive layer may be formed on the first insulating layer 10 (Step S12). Thereafter, a second insulating layer 20 may be formed on a first conductive layer 10. Referring to FIG. 5C, a second conductive layer may be formed on the second insulating layer 20 (Step S13). Next, a third insulating layer 30 may be formed on the second conductive layer. Referring to FIG. 5D, a second semiconductor layer AL2 may be formed on the third insulating layer 30 (Step S14). Referring to FIG. 5E, a first contact hole group may be formed (Step S15). The first contact hole group may include first to tenth contact holes CH1-CH10. Referring to FIG. 5F, a third conductive layer may be formed on the third insulating layer 30 (Step S16). A fourth insulating layer 40 may be formed on the third conductive layer. Referring to FIG. 5G, a second contact hole group may be formed (Step S17). The second contact hole group may include eleventh and twelfth contact holes CH11 and CH12. Referring to FIG. 5H, a shielding electrode SHD may be formed (Step S18). Thereafter, a fifth insulating layer 50 may be formed. Referring to FIG. 5I, a third contact hole group may be formed (Step S19). The third contact hole group may include thirteenth and fourteenth contact holes CH13 and CH14. Referring to FIGS. 5I and 5J, an organic light emitting diode ED may be formed (Step S20).

In an organic light emitting display apparatus according to some exemplary embodiments of the present inventive concept, a driving transistor may be configured to operate more reliably and efficiently and accordingly, the display quality of an organic light emitting display apparatus may be increased.

In a method of manufacturing an organic light emitting display apparatus according to some exemplary embodiments of the present inventive concept, it is possible to increase the display quality of an organic light emitting display apparatus.

While exemplary embodiments of the present inventive concepts have been particularly shown and described, it will be understood by one of ordinary skill in the art that variations in form and detail may be made therein without departing from the spirit and scope of the inventive concept.

What is claimed is:

1. An organic light emitting display (OLED) device, comprising:
an organic light emitting diode including an anode and a cathode, the cathode being configured to receive a reference voltage;
a control transistor including a first control electrode and a first semiconductor active layer, the control transistor being configured to receive a control signal;
a driving transistor including a second control electrode that is electrically connected to the control transistor, an input electrode that is configured to receive a power voltage, an output electrode that is electrically connected to the anode of the organic light emitting diode, and a second semiconductor active layer that includes a different material from that of the first semiconductor active layer; and
a shielding electrode disposed on the second semiconductor active layer, overlapping the driving transistor, and configured to receive the power voltage.

2. The OLED device of claim 1, wherein the first semiconductor active layer is disposed below the first control electrode, and
the second semiconductor active layer is disposed on the second control electrode.

3. The OLED device of claim 2, wherein the shielding electrode covers the second control electrode.

4. The OLED device of claim 2, wherein the shielding electrode covers the second semiconductor active layer.

5. The OLED device of claim 2, wherein the second semiconductor active layer comprises an oxide semiconductor material.

6. The OLED device of claim 5, wherein the oxide semiconductor material comprises at least one metal oxide of a metal selected from the group consisting of zinc (Zn), indium (In), gallium (Ga), tin (Sn), and titanium (Ti) or mixtures of metals and oxides thereof, wherein the metals comprise zinc (Zn), indium (In), gallium (Ga), tin (Sn), or titanium (Ti).

7. The OLED device of claim 2, wherein the first semiconductor active layer comprises poly silicon.

8. The OLED device of claim 1, wherein the shielding electrode comprises a same material as the input electrode of the driving transistor and the output electrode of the driving transistor.

9. The OLED device of claim 1, wherein the shielding electrode comprises a first layer containing Ti, a second layer containing Al, and a third layer containing Ti.

10. The OLED device of claim 1, wherein the control transistor comprises second to sixth transistors.

11. The OLED device of claim 10, further comprising:
a data line configured to receive a data voltage;
a power line configured to receive the power voltage;
a scan line configured to receive an i-th scan signal;
a dummy scan line configured to receive an (i−1)-th scan signal;
a refresh control line configured to receive an (i+1)-th scan signal;
a light-emitting line configured to receive a light-emitting control signal; and
a refresh line configured to receive an initialization voltage.

12. The OLED device of claim 11, wherein the input electrode of the driving transistor is coupled to the fifth transistor and the output electrode of the driving transistor is coupled to the sixth transistor,
- wherein the second transistor comprises an input electrode coupled to the data line, a control electrode coupled to the scan line, and an output electrode coupled to the output electrode of the driving transistor,
- wherein the third transistor comprises an input electrode coupled to the input electrode of the driving transistor, a control electrode coupled to the scan line, and an output electrode coupled to the first control electrode of the driving transistor,
- wherein the fourth transistor comprises an input electrode coupled to the power line, a control electrode coupled to the dummy scan line, and an output electrode coupled to the first control electrode of the driving transistor,
- wherein the fifth transistor comprises an input electrode coupled to the power line, a control electrode coupled to the light-emitting line, and an output electrode coupled to the input electrode of the driving transistor,
- wherein the sixth transistor comprises an input electrode coupled to the output electrode of the driving transistor, a control electrode coupled to the light-emitting line, and an output electrode coupled to the anode of the organic light emitting diode, and
- wherein the seventh transistor comprises an input electrode coupled to the refresh line, an control electrode coupled to the refresh control line, and an output electrode coupled to the anode of the organic light emitting diode.

13. An organic light emitting display (OLED) device, comprising:
- an organic light emitting diode including an anode and a cathode, the cathode being configured to receive a reference voltage;
- a control transistor including a first control electrode and a first semiconductor active layer, wherein the first control electrode is configured to receive a control signal, and wherein the first semiconductor active layer is disposed below the first control electrode;
- a driving transistor including a second control electrode, an input electrode, an output electrode, and a second semiconductor active layer, wherein the second control electrode is electrically connected to the control transistor, wherein the input electrode is configured to receive a power voltage, wherein the output electrode is electrically connected to the anode of the organic light emitting diode, and wherein the second semiconductor active layer is disposed on the second control electrode; and
- a shielding electrode disposed on the second semiconductor active layer, wherein the shielding electrode overlaps the driving transistor and is configured to receive the power voltage.

14. The OLED device of claim 13, wherein the second semiconductor active layer comprises a different material from that of the first semiconductor active layer.

15. The OLED device of claim 14, wherein the first semiconductor active layer comprises poly silicon, and the second semiconductor active layer comprises an oxide semiconductor material.

16. The OLED device of claim 13, wherein the shielding electrode is disposed over the second semiconductor active layer.

17. A method of manufacturing an organic light emitting display apparatus, comprising:
- forming a first semiconductor layer on a base substrate;
- forming a first conductive layer on the first semiconductor layer;
- forming a second conductive layer on the first conductive layer;
- forming a second semiconductor layer on the second conductive layer; and
- forming a shielding electrode on the second semiconductor active layer,
- wherein a portion of the first semiconductor layer forms a first semiconductor active layer of a control transistor,
- wherein a portion of the first conductive layer forms a first control electrode of the control transistor,
- wherein a portion of the second conductive layer forms a second control electrode of a driving transistor, and
- wherein a portion of the second semiconductor layer forms a second semiconductor active layer of the driving transistor.

18. The method of claim 17, wherein a buffer layer is formed between the base substrate and the first semiconductor layer, and wherein insulating layers are formed:
- between the first conductive layer and the first semiconductor layer,
- between the first conductive layer and the second conductive layer, and
- between the second semiconductor layer and the second conductive layer.

19. The method of claim 17, further comprising,
- forming a third conductive layer, a portion of which is used as a power line and a data line after the forming of the second semiconductor layer and before the forming of the shielding electrode; and
- exposing a portion of the power line,
- wherein the shielding electrode is connected the exposed portion of the power line.

20. The method of claim 17, wherein the shielding electrode is formed to cover the second semiconductor active layer.

21. The method of claim 17, wherein the second semiconductor layer is formed by depositing and patterning an oxide semiconductor material.

22. An organic light emitting display device, comprising:
- an organic light emitting diode receiving a power voltage through a power line;
- a driving transistor including a channel region; and
- a shielding electrode disposed over the channel region of the driving transistor and configured to receive the power voltage.

* * * * *